United States Patent
Frampton et al.

(10) Patent No.: US 8,963,349 B2
(45) Date of Patent: Feb. 24, 2015

(54) GENERATOR MANAGEMENT SYSTEM THAT SELECTIVELY CUTS OFF FUEL TO A GENERATOR TO ADD A LOAD TO A BUS

(75) Inventors: Isaac S. Frampton, Strattanville, PA (US); Richard A. Mauk, Sheboygan, WI (US); Douglas W. Dorn, Sheboygan Falls, WI (US)

(73) Assignee: Kohler, Co., Kohler, WI (US)

( * ) Notice: Subject to any disclaimer, the term of this patent is extended or adjusted under 35 U.S.C. 154(b) by 190 days.

(21) Appl. No.: 13/540,146

(22) Filed: Jul. 2, 2012

(65) Prior Publication Data

US 2014/0001769 A1   Jan. 2, 2014

(51) Int. Cl.
*F02D 25/00* (2006.01)
*F02D 29/06* (2006.01)
*H02J 3/00* (2006.01)

(52) U.S. Cl.
CPC .......................................... *H02J 3/00* (2013.01)
USPC ....................................................... 290/4 A

(58) Field of Classification Search
CPC ................................... H02J 3/00; H02P 9/04
USPC ... 290/4 A, 40 R, 40 A, 4 R, 4 C, 40 B, 40 C, 290/40 F
See application file for complete search history.

(56) References Cited

U.S. PATENT DOCUMENTS

| | | | |
|---|---|---|---|
| 2,832,896 A | 4/1958 | Stineman et al. | |
| 3,300,647 A | 1/1967 | Gogia et al. | |
| 3,489,914 A | 1/1970 | Taylor | |
| 4,233,555 A | 11/1980 | Roche | |
| 4,302,683 A | 11/1981 | Burton | |
| 4,405,892 A | 9/1983 | Staerzl | |
| 4,469,071 A | 9/1984 | Bassi et al. | |
| 4,625,123 A | 11/1986 | Gillett et al. | |
| 4,899,706 A | 2/1990 | Sasaki | |
| 5,252,905 A | 10/1993 | Wills et al. | |
| 5,256,959 A | 10/1993 | Nagano et al. | |
| 5,625,276 A | 4/1997 | Scott et al. | |
| 5,635,768 A | 6/1997 | Birch et al. | |
| 5,694,027 A | 12/1997 | Satake et al. | |
| 5,703,410 A | 12/1997 | Maekawa | |
| 5,730,098 A | 3/1998 | Sasak et al. | |
| 5,886,890 A | 3/1999 | Ishida et al. | |
| 6,844,706 B2 | 1/2005 | Pinkerton, III et al. | |

(Continued)

FOREIGN PATENT DOCUMENTS

EP   1006641 A2   6/2000

OTHER PUBLICATIONS

"European Application No. 13003380.6, European Search Report dated Feb. 17, 2014", 9 pgs.

*Primary Examiner* — Javaid Nasri
(74) *Attorney, Agent, or Firm* — Schwegman, Lundberg & Woessner, P.A.

(57) ABSTRACT

Some embodiments relate to an example generator management system. The generator management system includes a first generator having a first set of power leads and a second generator having a second set of power leads. The generator management system further includes a bus that connects the first output and the second output. A controller selectively cuts off fuel to the second generator to add a load to the bus. It should be noted that embodiments are contemplated where the generator management system alternatively cuts off fuel to the first generator to add a load to the bus.

12 Claims, 8 Drawing Sheets

(56) References Cited

U.S. PATENT DOCUMENTS

| | | |
|---|---|---|
| 6,894,403 B2 | 5/2005 | Shinogi |
| 6,923,168 B2 | 8/2005 | Bryde |
| 8,049,348 B2 | 11/2011 | Czajkowski |
| 2006/0244327 A1 | 11/2006 | Kundel |
| 2007/0262661 A1 | 11/2007 | Ai |
| 2010/0094490 A1* | 4/2010 | Alston et al. .................. 701/21 |
| 2011/0149624 A1 | 6/2011 | Yamanaka |
| 2011/0291411 A1 | 12/2011 | Folken |
| 2012/0007431 A1 | 1/2012 | Jang et al. |
| 2012/0242451 A1 | 9/2012 | Tanaka et al. |
| 2014/0001873 A1 | 1/2014 | Tian et al. |
| 2014/0028102 A1 | 1/2014 | Frampton |

* cited by examiner

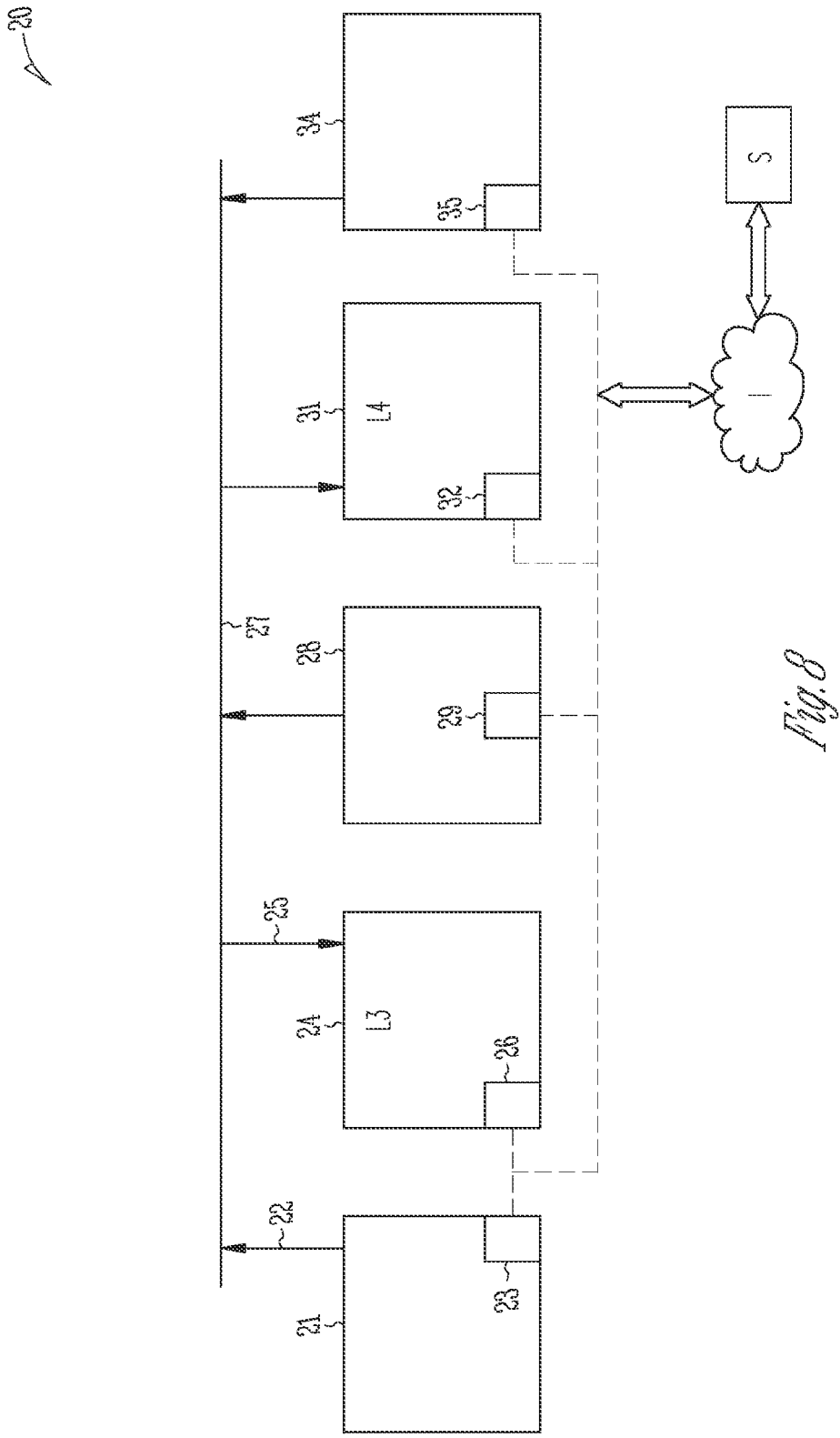

GENERATOR MANAGEMENT SYSTEM THAT SELECTIVELY CUTS OFF FUEL TO A GENERATOR TO ADD A LOAD TO A BUS

TECHNICAL FIELD

Embodiments pertain to a generator management system, and more particularly to a generator management system that selectively cuts off fuel to a generator to add a load to a bus.

BACKGROUND

Electric generators are typically used to provide electrical power. One common use of electric generators is as a standby power source.

One common type of electric generator includes an internal combustion engine. The internal combustion engine drives an electrical alternator that produces alternating electricity.

Many existing system often include multiple electric generators, especially in situations where there is a potential high demand for power. There can be advantages to employing multiple small generators rather than a single large generator.

One of the advantages is that if one generator fails, or requires maintenance, a multi-generator system can still supply some power while a single generator system would otherwise not be able to meet demand. Another advantage is that load growth may be addressed by adding another generator rather than replacing an existing generator with a larger (and more expensive) generator.

Another advantage of using multiple smaller generators is that they can be tested individually. Therefore, these multiple smaller generators can be tested using relatively smaller loads.

Testing using relatively smaller loads is beneficial because there is decreased fuel consumption and lower expense for load banks. A load is required during testing to (i) avoid an accumulation of unburned fuel within the exhaust system of a generator; (ii) to activate a catalyst to minimize air pollution; and (iii) verify load carrying ability of a generator.

One of the drawbacks with existing generator management systems is that they usually require external load to be provided for testing. An external load is typically provided for testing by (i) transferring site load to the standby source, or (ii) using a resistive load bank.

Transferring site load to the standby source is undesirable because it often results in a brief interruption of power to the site. In addition, transferring site load to the standby source is undesirable because any failures during a test can result in a loss of power to the site.

Providing a resistive load bank for testing the standby generators is undesirable because it adds additional required maintenance. In addition, providing a resistive load bank adds unwanted cost and takes up space.

BRIEF DESCRIPTION OF THE DRAWINGS

FIG. 8 shows the generator management system of FIG. 7 after the generator management system has selectively cuts off fuel to a plurality of generators to add loads to the bus.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
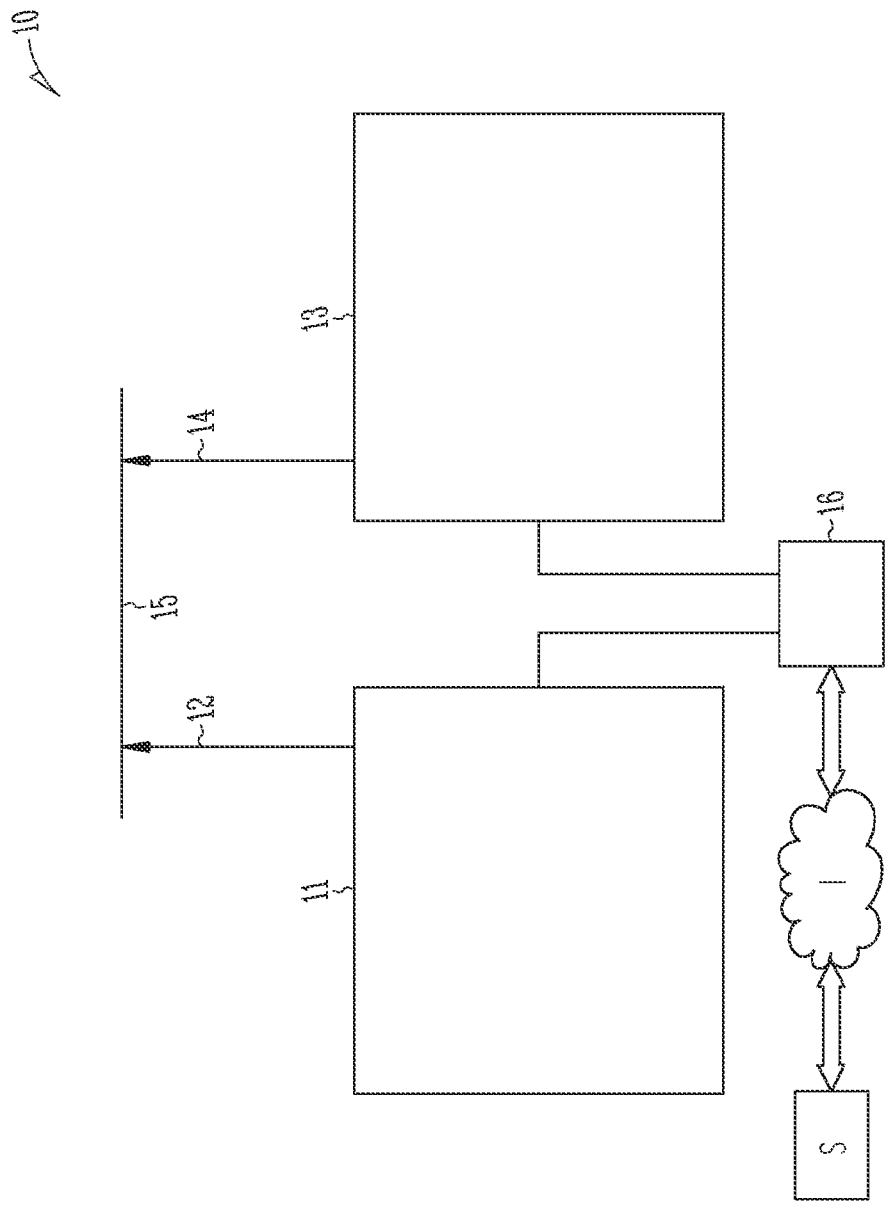
FIG. 1 is a schematic plan view of an example generator management system before the generator management system selectively cuts off fuel to a generator to add a load to a bus.

FIG. 1 is a schematic plan view of an example generator management system 10. The generator management system 10 includes a first generator 11 having a first set of power leads 12 and a second generator 13 having a second set of power leads 14.

The generator management system 10 further includes a bus 15 that connects the first output 12 and the second output 14. A controller 16 selectively cuts off fuel to the second generator 13 to add a load L1 to the bus 15 (see FIG. 2). It should be noted that embodiments are contemplated where the generator management system 10 alternatively cuts off fuel to the first generator 11 to add a load to the bus 15.

Figure 2:
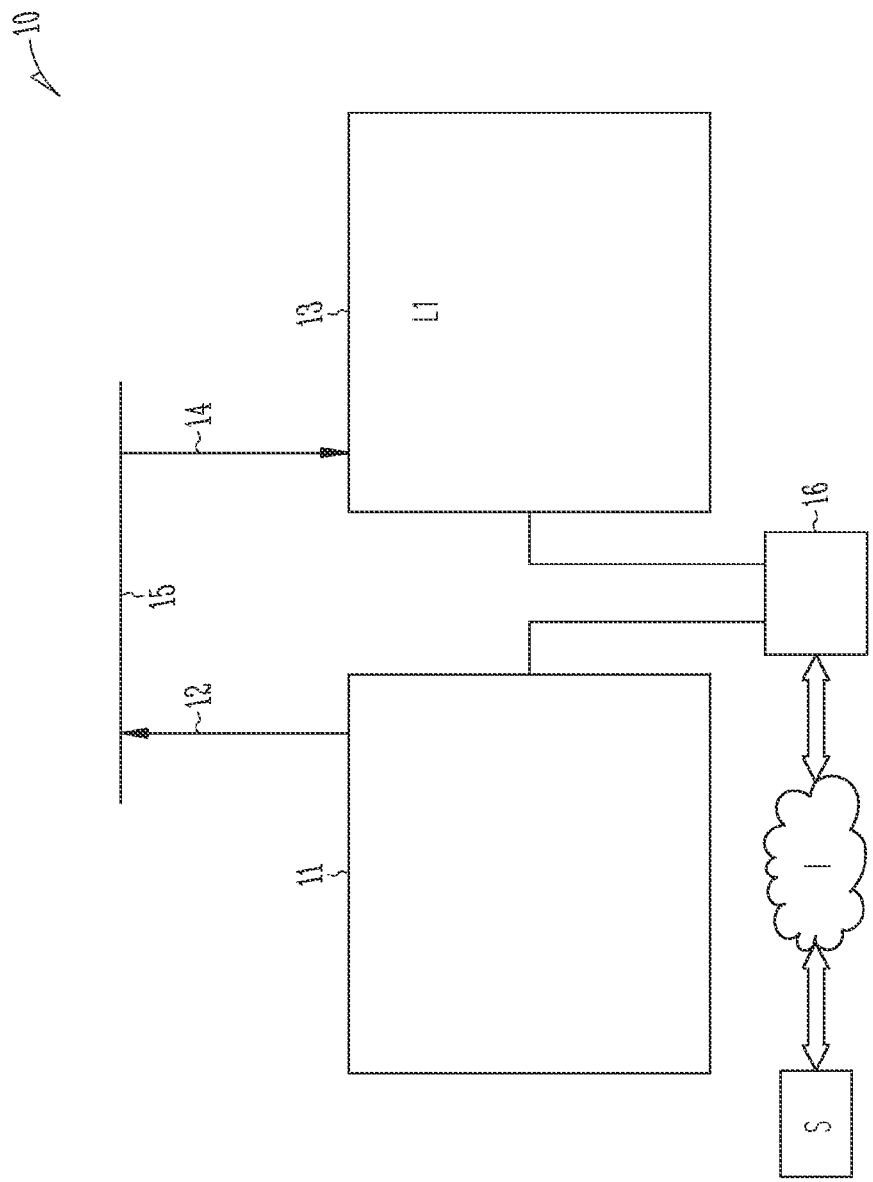
FIG. 2 shows the generator management system of FIG. 1 after the generator management system has selectively cut off fuel to a generator to add the load to a bus.

FIG. 1 shows the generator management system 10 before the generator management system 10 selectively cuts off fuel to at least one of the first generator 11 and the second generator 13. Power may be supplied to the bus 15 by the first generator 11 through power leads 12 and/or the second generator 13 through power leads 14. FIG. 2 shows the generator management system 10 after the generator management system 10 has selectively cut off fuel to second generator 13 to provide a load L1 to the bus 15. Power is supplied from the first generator 11 to the load L1 through power leads 12, the bus 15 and power leads 14.

Figure 3:
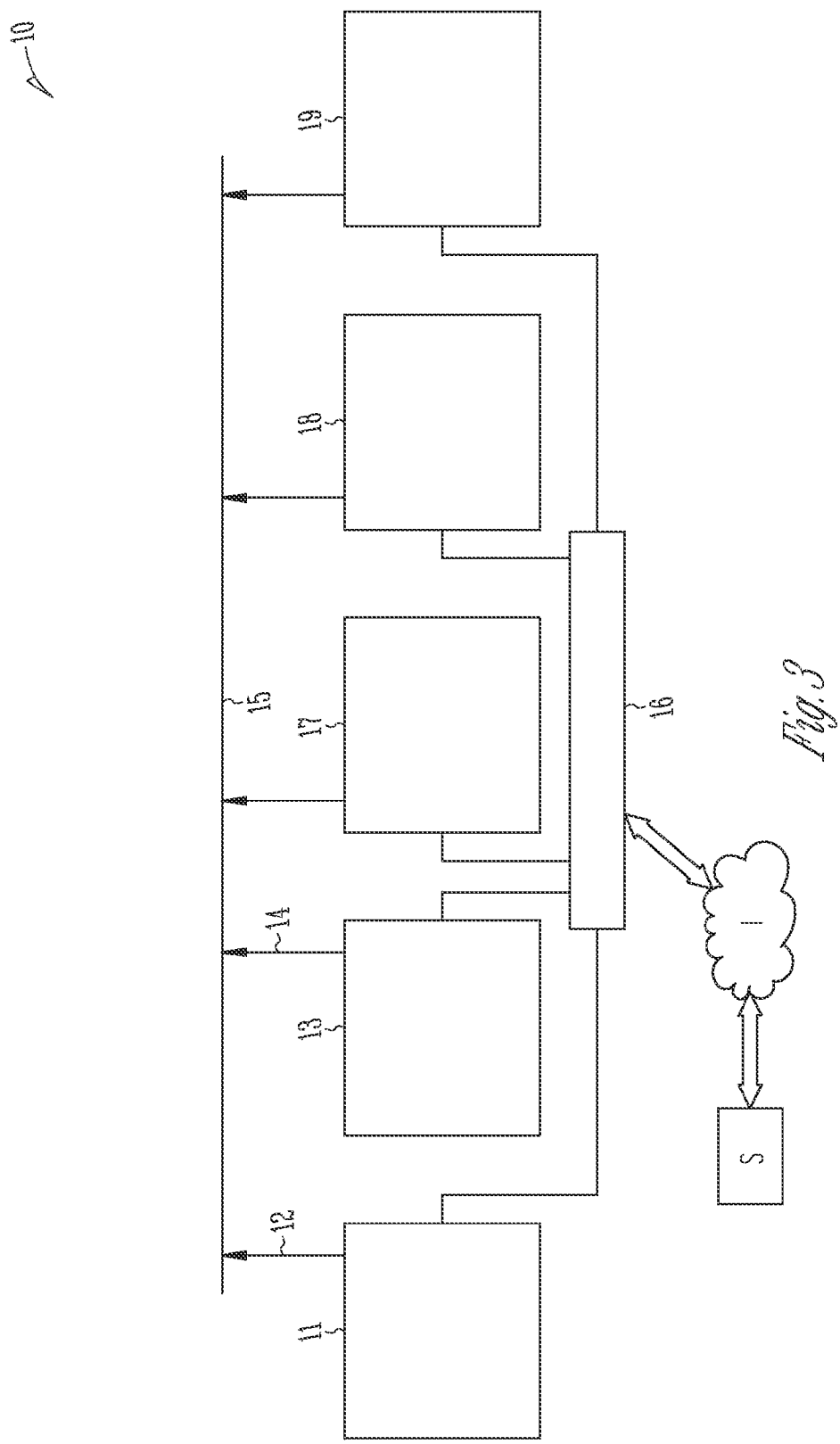
FIG. 3 shows the generator management system of FIG. 1 where the generator management system includes additional generators.
Figure 4:
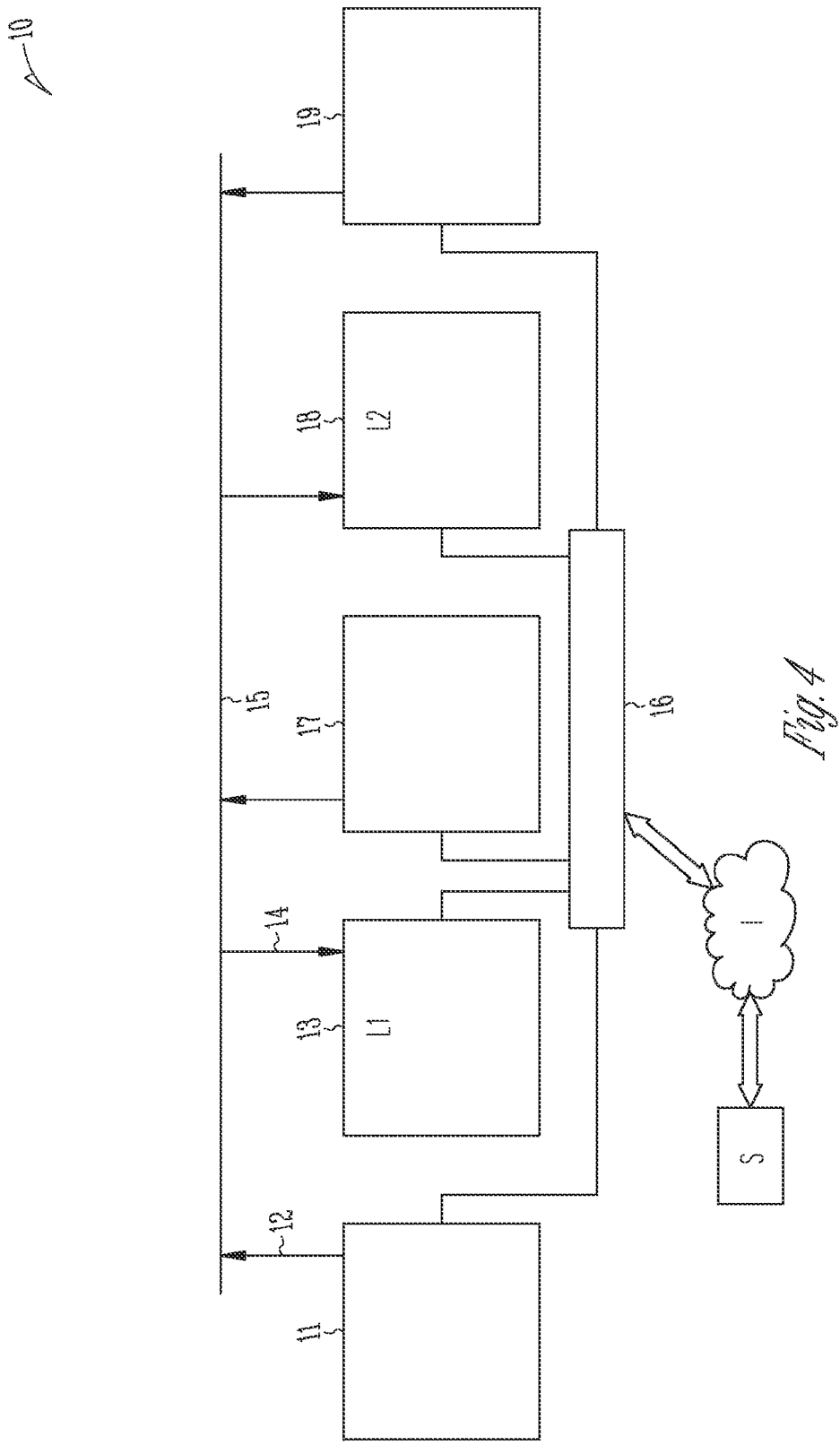
FIG. 4 shows the generator management system of FIG. 3 after the generator management system has selectively cuts off fuel to a plurality of generators to add loads to the bus.

FIG. 3 shows an example embodiment of the generator management system 10 where the first generator 11 and the second generator 13 are part of a plurality of additional generators 17, 18, 19 that are connected to the bus 15. All of the generators 11, 13, 17, 18, 19 are supplying power to the bus 15 through their respective power leads. FIG. 4 shows the example embodiment of FIG. 3 after the controller 16 selectively cuts off fuel to at least one of the plurality of additional generators to provide load L1, L2 to the bus 15. As shown, fuel is cut off to generator 13 and generator 18 and power is supplied from generators 11, 17, 19 to the loads L1, L2 through the respective power leads and the bus 15.

Although fuel is cut off to second generator 13 and one of the additional generators 18 in the example embodiment illustrated in FIG. 4, it should be noted that the controller 16 may cut off fuel to any individual generator or combination of the generators 11, 13, 17, 18, 19 in order to add load(s) to the bus 15. Embodiments are contemplated where the controller 16 selectively cuts off fuel to any number of generators, where the number of generators with fuel cut off is dependent on a minimum bus load requirement.

As examples, the minimum bus load requirement may be determined based on local emission standards. As another example, the minimum bus load requirement may be determined based on a minimum engine exhaust temperature of at least one of the plurality of generators 11, 13, 17, 18, 19 that is supplying power to the loads.

In some embodiments, at least one of the plurality of generators 11, 13, 17, 18, 19 may include a diesel engine that has a particulate filter. In embodiments where the generator management system 10 includes one or more diesel engines that have a particulate filter, the minimum bus load requirement may depend on scheduled regeneration of one or more the particulate filters.

As shown in FIGS. 1-4, the generator management system 10 may further include a server S that is connected to the controller 16 via a network (e.g., the Internet I). In embodiments where the generator management system 10 includes a server S, at least one of the controller 16 and the server S may selectively cut off fuel to any of the generators 11, 13, 17, 18, 19 to add a load to the bus 15.

Figure 5:
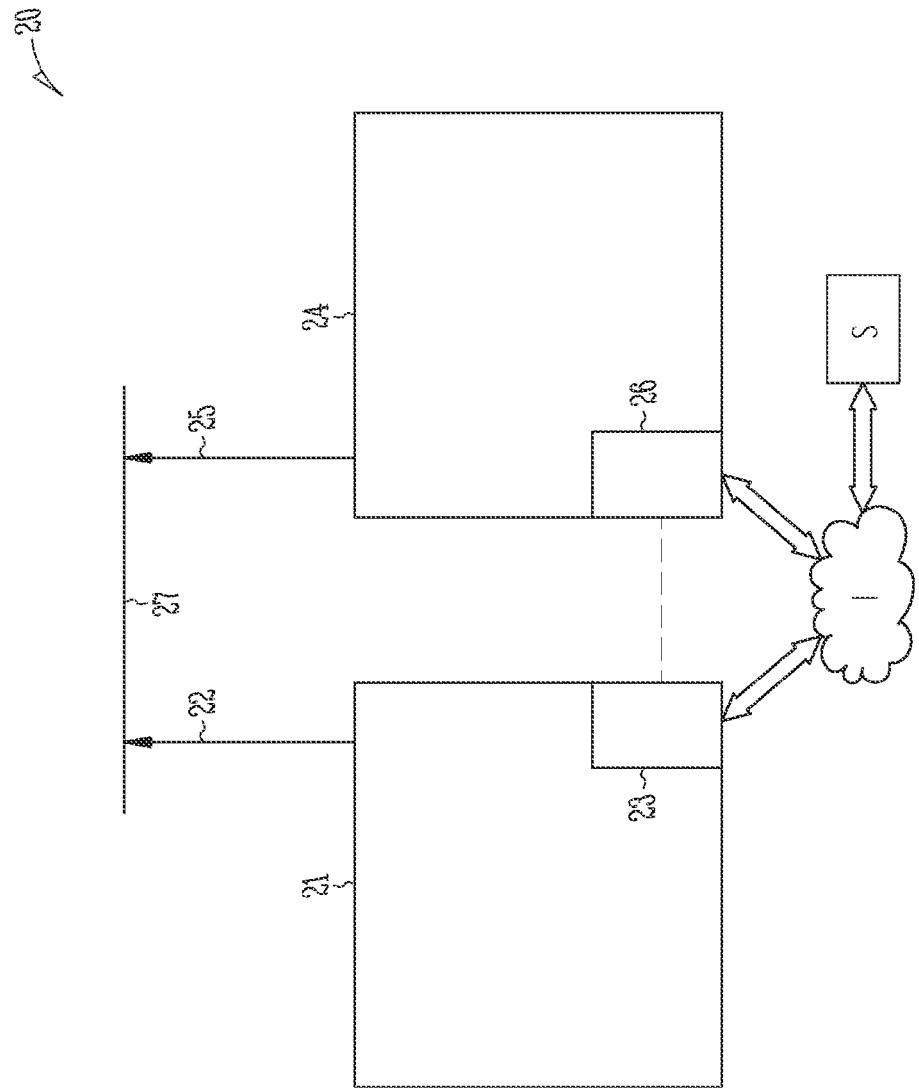
FIG. 5 is a schematic plan view of another example generator management system before the generator management system selectively cuts off fuel to a generator to add a load to a bus.

FIG. 5 is a schematic plan view of another example generator management system 20. The generator management system 20 includes a first generator 21 having a first set of power leads 22. A first generator controller 23 operates the first generator 21.

The generator management system 20 further includes a second generator 24 having a second set of power leads 25. A second generator controller 26 operates the second generator 24.

The generator management system 20 further includes a parallel bus 27 that connects the first set of power leads 22 and the second set of power leads 25. FIG. 5 shows the generator management system 20 before at least one of the first generator controller 23 and the second generator controller 26 selectively cuts off fuel to the second generator 24. The first generator 21 may supply power to the bus 15 through power leads 22 and the second generator 24 may supply power to the bus 15 through power leads 25.

Figure 6:
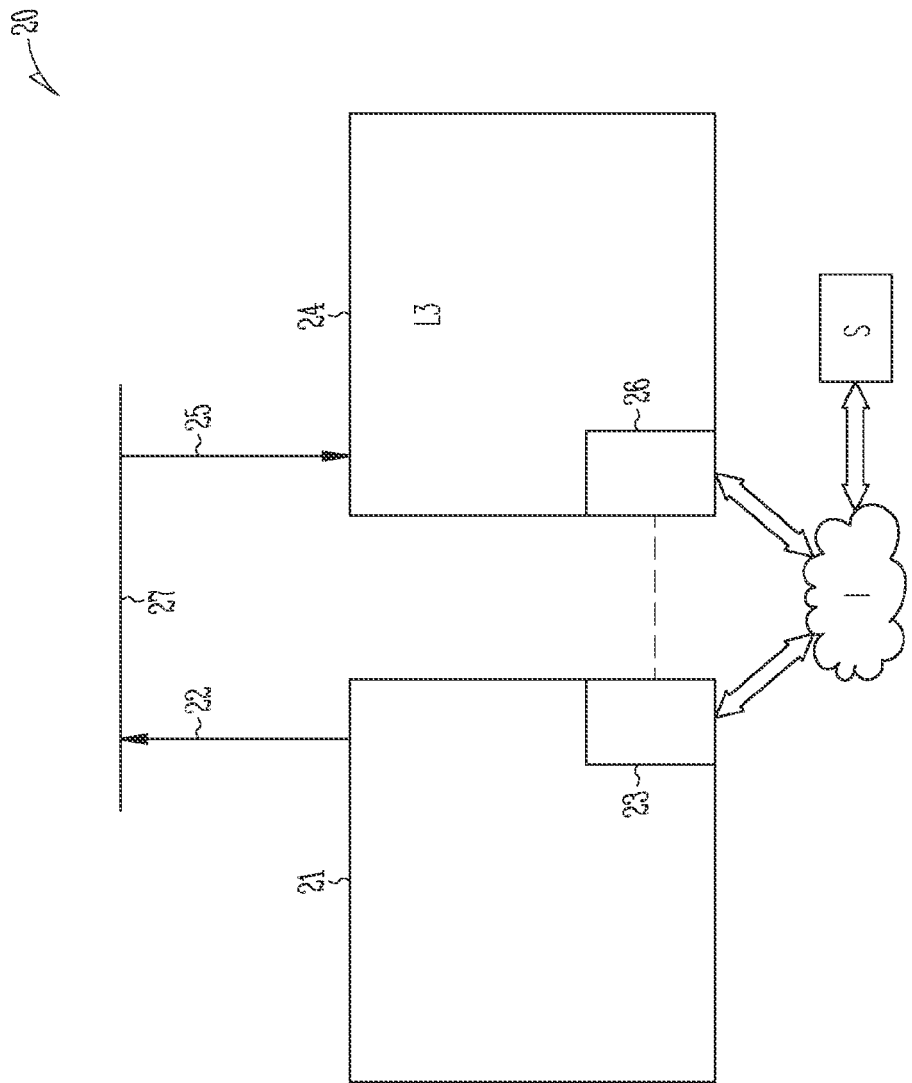
FIG. 6 shows the generator management system of FIG. 5 after the generator management system has selectively cut off fuel to a generator to add a load to the bus.

FIG. 6 shows the generator management system 20 after at least one of the first generator controller 23 and the second generator controller 26 has selectively cut off fuel to second generator 24 to add a load L3 to the parallel bus 27. Therefore, power is supplied from the first generator 21 to the load L3 through power leads 22, the bus 27 and power leads 25.

Figure 7:
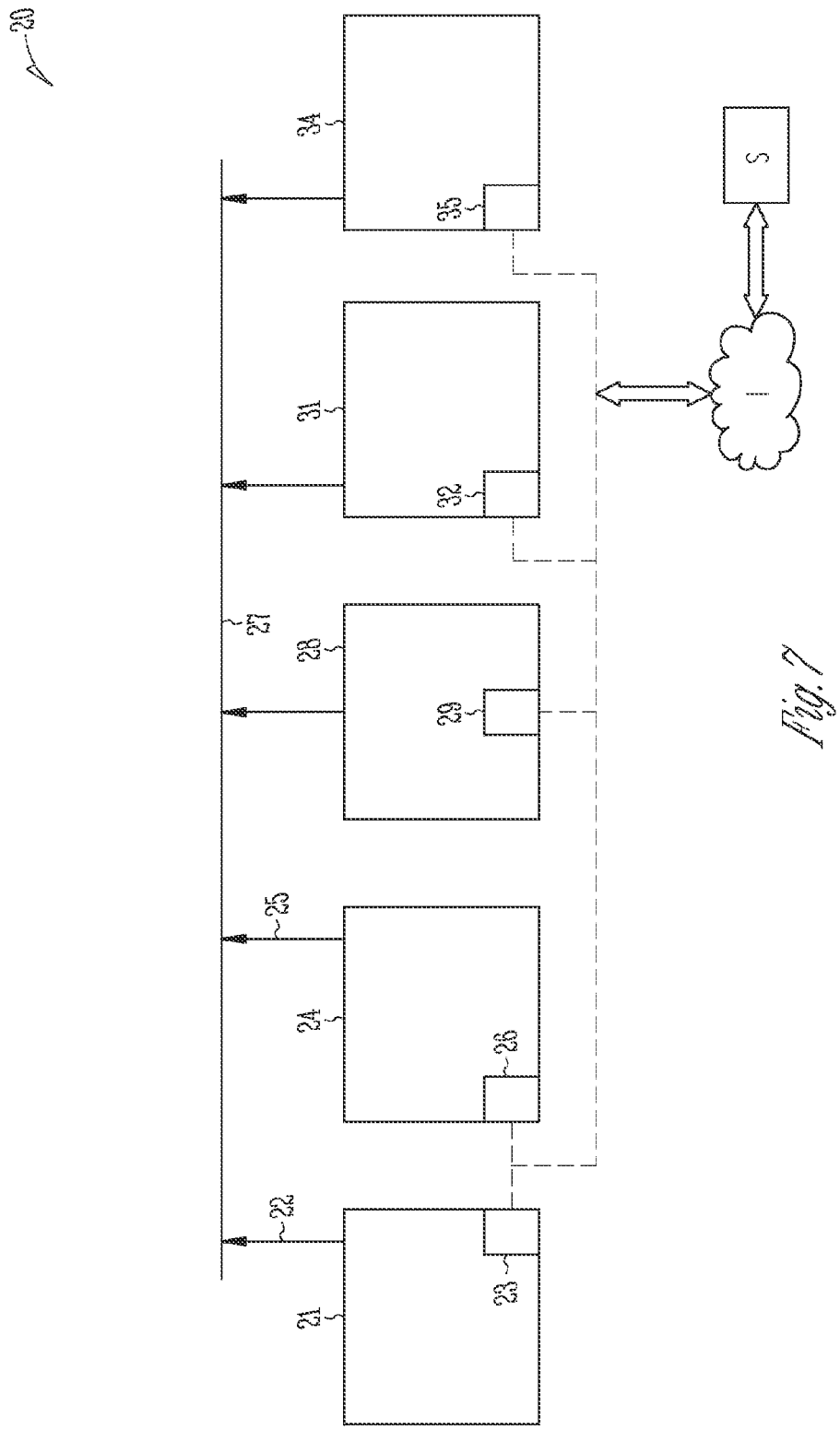
FIG. 7 shows the generator management system of FIG. 5 where the generator management system includes additional generators.

FIG. 7 shows an example embodiment of the generator management system 20 where the first generator 21 and the second generator 24 are part of a plurality of additional generators 28, 31, 34. All of the generators 21, 24, 28, 31, 34 are supplying power to the bus 27 through their respective power leads. It should be noted that each of the additional generators 28, 31, 34 that are connected to the parallel bus 27 may (or may not) include a generator controller. FIG. 7 shows an example embodiment where each of the additional generators 28, 31, 34 include a respective generator controller 29, 32, 35.

FIG. 8 shows the example embodiment of FIG. 7 after at least one the respective generator controllers 23, 26, 29, 32, 35 selectively cuts off fuel to at least one of the plurality of generators 21, 24, 28, 31, 34. As shown, fuel is cut off to generator 24 and generator 31 and power is supplied from generators 21, 28, 34 to the loads L3, L4 through the respective power leads and the bus 27. Although fuel is cut off to second generator 24 and one of the additional generators 32 in the example embodiment illustrated in FIG. 8, it should be noted that at least one the respective generator controllers 23, 26, 29, 32, 35 may cut off fuel to any individual generator or combination of the generators 21, 24, 28, 31, 34 in order to add load(s) to the parallel bus 27. Embodiments are contemplated where at least one (or more) of the respective generator controllers 23, 26, 29, 32, 35 selectively cuts off fuel to any number of generators, where the number of generators with fuel cut off is dependent on a minimum bus load requirement.

As examples, the minimum bus load requirement may be determined based on local emission standards. As another example, the minimum bus load requirement may be determined based on a minimum engine exhaust temperature of at least one of the plurality of generators 21, 24, 28, 31, 34 that is supplying power to the loads.

In some embodiments, at least one of the plurality of generators 21, 24, 28, 31, 34 may include a diesel engine that has a particulate filter. In embodiments where the generator management system 20 includes one or more diesel engines that have a particulate filter, the minimum bus load requirement may depend on scheduled regeneration of one or more the particulate filters.

As shown in FIGS. 5-8, the generator management system 20 may further include a server S that is connected to one, some or all of the respective generator controllers 23, 26, 29, 32, 35 via a network (e.g., the Internet I). In embodiments where the generator management system 10 includes a server S, none, one, some or all of the respective generator controllers 23, 26, 29, 32, 35 and/or the server S may selectively cut off fuel to any of the generators 21, 24, 28, 31, 34 to add a load(s) to the parallel bus 27.

The generator management systems 10, 20 described herein may reduce the need to provide an external load for testing of generators. In addition, generator management systems 10, 20 may permit testing of generators without interruption of power to the site.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A generator management system comprising:
   a first generator having a first set of power leads;
   a second generator having a second set of power leads;
   a bus connecting the first set of power leads and the second set of power leads; and
   an automatic controller that selectively cuts off fuel to the second generator to use the second generator as a load to the bus.

2. The generator management system of claim 1, wherein power is supplied to the load on the bus by the first generator.

3. The generator management system of claim 1, where the first generator and the second generator are part of a plurality of generators that are connected to the bus, wherein the automatic controller selectively cuts off fuel to at least one of the plurality of generators to add load to the bus.

4. The generator management system of claim 3, wherein the automatic controller selectively cuts off fuel to a number of generators, wherein the number of generators depends on a minimum bus load requirement.

5. The generator management system of claim 4, wherein the minimum bus load requirement is determined based on local emission standards.

6. The generator management system of claim 4, wherein the minimum bus load requirement is determined by a minimum engine exhaust temperature of at least one of the plurality of generators that is supplying power to the loads.

7. The generator management system of claim 4, wherein at least one of the plurality of generators includes a diesel engine that has a particulate filter, and wherein the minimum bus load requirement depends on scheduled regeneration of the particulate filter.

8. The generator management system of claim 1 further comprising a server that is connected to the automatic controller via a network, wherein at least one of the automatic controller and the server selectively cuts off fuel to the first generator to add a load to the bus.

9. A generator management system comprising:
a first generator having a first set of power leads;
a second generator having a second set of power leads;
a bus connecting the first set of power leads and the second set of power leads; and
an automatic controller that selectively adds the second generator as a load to the bus by cutting off fuel to the second generator.

10. The generator management system of claim 9, wherein power is supplied to the load on the bus by the first generator.

11. The generator management system of claim 10, where the first generator and the second generator are part of a plurality of generators that are connected to the bus, wherein the automatic controller selectively adds at least one of the plurality of generators as a load to the bus by cutting off fuel to the at least one of the plurality of generators.

12. The generator management system of claim 11, wherein the automatic controller selectively adds a number of generators as loads to the bus by cutting off fuel to the number of generators, wherein the number of generators depends on a minimum bus load requirement.

* * * * *